United States Patent [19]
Hosono

[11] Patent Number: 5,272,116
[45] Date of Patent: Dec. 21, 1993

[54] METHOD FOR PATTERN DEFECT CORRECTION OF A PHOTOMASK

[75] Inventor: Kunihiro Hosono, Hyogo, Japan

[73] Assignee: Mitsubishi Denki Kabushiki Kaisha, Tokyo, Japan

[21] Appl. No.: 977,365

[22] Filed: Nov. 17, 1992

[30] Foreign Application Priority Data

Nov. 18, 1991 [JP] Japan .................. 3-301996

[51] Int. Cl.⁵ .................. H01L 21/465
[52] U.S. Cl. .................. 437/228; 437/923; 156/643; 250/492.2; 430/5
[58] Field of Search .................. 437/228, 20; 156/646; 250/492.2, 309; 430/5

[56] References Cited

U.S. PATENT DOCUMENTS

| | | | |
|---|---|---|---|
| Re. 33,193 | 4/1990 | Yamaguchi et al. | 250/309 |
| 4,548,883 | 10/1985 | Wagner et al. | 430/5 |
| 4,925,755 | 5/1990 | Yamaguchi et al. | 430/5 |
| 4,933,565 | 6/1990 | Yamaguchi et al. | 250/492.2 |

FOREIGN PATENT DOCUMENTS

| | | |
|---|---|---|
| 57-62052 | 4/1982 | Japan . |
| 62-189468 | 8/1987 | Japan . |
| 63-47769 | 2/1988 | Japan . |
| 1-15922 | 1/1989 | Japan . |

*Primary Examiner*—Olik Chaudhuri
*Assistant Examiner*—H. Jey Tsai
*Attorney, Agent, or Firm*—Lowe, Price, LeBlanc & Becker

[57] ABSTRACT

A pattern defect correction method of a photomask includes the steps of directing a focused ion beam to scan a small region including a pattern defect after a planarization film is formed on a region including a pattern defect of a phase shift mask to etch the small region. By monitoring a change in the intensity of a secondary signal, the end of an etching process is detected, followed by removal of the planarization film. According to this method, a pattern defect of a phase shift mask which is used in manufacturing an LSI can be corrected in high precision.

15 Claims, 18 Drawing Sheets

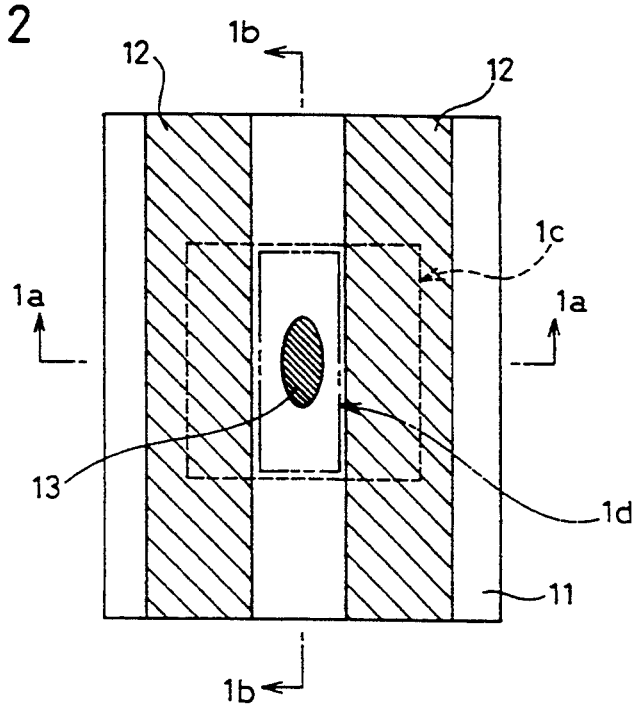
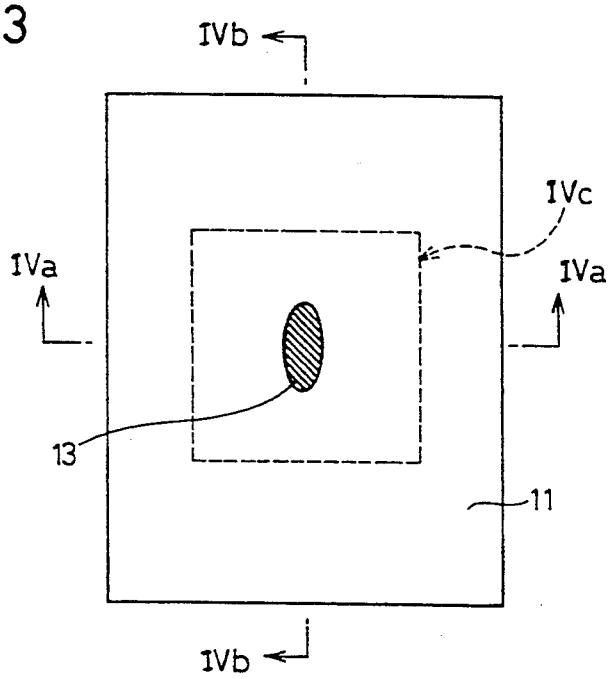

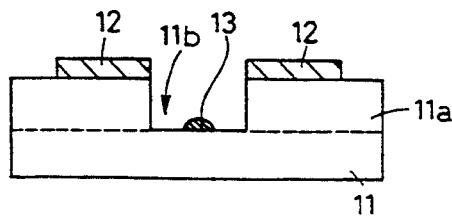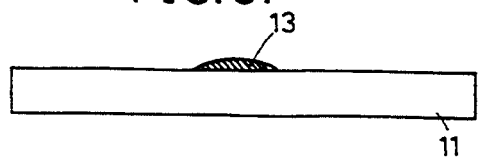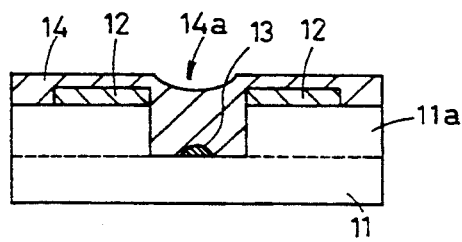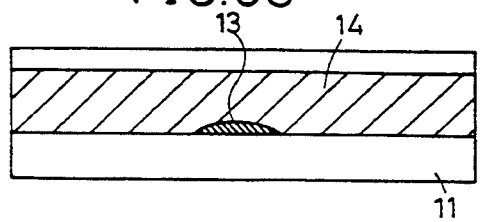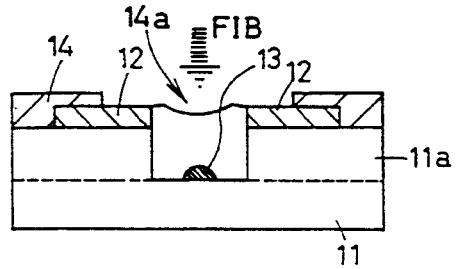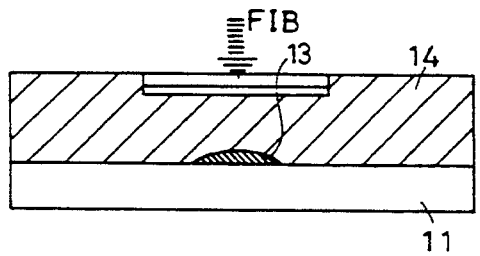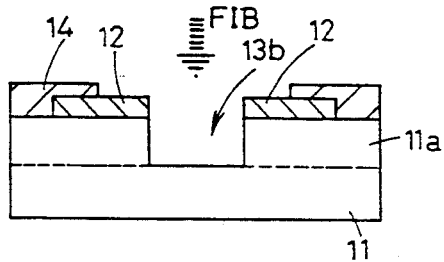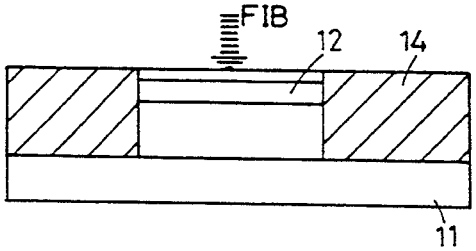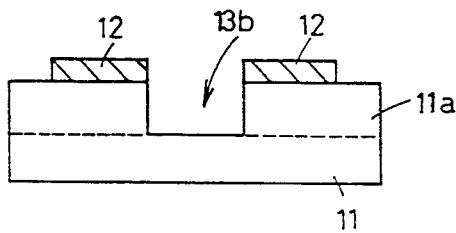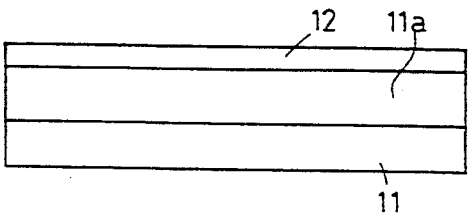

ELECTRIC FIELD
ON MASK

LIGHT INTENSITY
ON MASK

METHOD FOR PATTERN DEFECT CORRECTION OF A PHOTOMASK

BACKGROUND OF THE INVENTION

1. Field of the Invention

The present invention relates to a pattern defect correction method of a photomask, and more particularly, to a method of correcting in high precision by a focused ion beam (referred to as FIB hereinafter) an opaque defect (pattern residue) and the like of a phase shift pattern generated informing a phase shift mask used in manufacturing an LSI.

2. Description of the Background Art

In manufacturing a semiconductor, the resolution R (μm) of lithography technique used in patterning interconnections is represented as:

$$R = k_1 \lambda/NA, \quad k_1 = 0.5$$

where λ is the light wavelength (μm) used for exposure, and NA is the numerical aperture of the lens. According to the above equation, the resolution of photolithography is decreased as the light wavelength becomes smaller, and also if the value of NA increases or if constant $k_1$ depending on the resist decreases. Using an i-line as the light for exposure (λ=0.365 μm) with numerical aperture NA=0.5 and constant $k_1$=0.5, a resolution of approximately 0.4 μm is obtained. In order to improve the resolution, the light wavelength must be reduced or the value of the numerical aperture NA be increased. However, it is technically difficult to obtain a photolens meeting such conditions, and the depth of focus δ ($\equiv \lambda/2NA^2$) will be reduced.

To overcome such problems, a phase shift exposure method is proposed in, for example, Japanese Patent Laying-Open No. 57-62052 and Japanese Patent Laying-Open No. 58-173744.

A conventional photomask that does not shift the phase, and a conventional photomask using a phase shift mask will be described hereinafter with reference to FIGS. 13A–13C and FIGS. 14A–14C.

In a conventional photomask which does not shift the phase, the electric field of light passing between the mask patterns 2 formed on a mask substrate 1 (FIG. 13A) is spatially separated from each other as shown in FIG. 13B. However it is not possible to focus an image of the mask patterns because the light intensity is distributed continuously as shown in FIG. 13C.

In the case of using a phase shift film, a phase shift pattern 3 formed of a $SiO_2$ film or the like is provided at every other portion between neighboring mask patterns 2, as shown in FIG. 14A. The phase of light passing between the mask patterns 2 will be displaced in phase by 180 degrees, so that the patterns of the electric field on the mask is distributed in inversion at every other pattern, as shown in FIG. 14B. Therefore, the light intensity on the mask shows a separated pattern, as shown in FIG. 14C. By using a phase shift mask with the above-described mechanism, the resolution can be reduced to approximately a half of the pattern width in comparison with the case of a photomask that does not shift the phase.

A method of correcting an opaque defect of a photomask using a conventional phase shift mask will be described hereinafter with reference to FIG. 15 and FIGS. 16A–16F.

Referring to FIG. 15, an opaque defect 13 is generated due to the material of a phase shifter remaining in a region between light shielding films 12 formed of a metal such as Cr or an intermetallic compound such as MoSi and not covered with the phase shifter on a mask substrate 11. The removal of the opaque defect 13 was carried out conventionally as shown in the steps of FIGS. 16A–16C and FIGS. 16D–16F. More specifically, an FIB is directed to scan only the region in the proximity of the opaque defect (the region XVIc in FIG. 15) to remove the opaque defect 13 by etching (FIG. 16B; FIG. 16E). When the etching process is stopped at the time the opaque defect 13 is completely removed, a recess 13a running along the configuration of the opaque defect 13 is seen due to the surface of the mask substrate 11 being overetched. The generation of such a recess 13a along the configuration of the opaque defect 13 on the surface of the mask substrate 11 is caused by the fact that the quartz used as the material of the mask substrate (11) and the SOG (Spin On Glass) used as the material of the phase shifter forming the opaque defect substantially have the same etching rate.

Because the correction method of a pattern defect of a photomask having a phase shift pattern was carried out as described above, a portion of the mask substrate was etched to result in a recess portion affected by the profile of the opaque defect in the defect region after the correction process. This will degrade the performance of the photomask.

SUMMARY OF THE INVENTION

An object of the present invention is to provide a pattern defect correction method of a photomask that can correct in high accuracy a pattern defect such as an opaque defect in a phase shifter generated in forming a photomask including a phase shift pattern without the disadvantage of the mask substrate being etched.

A pattern defect correction method of a photomask of the present invention for achieving the above object includes the method of removing a pattern defect of a phase shifter generated in a region that is not covered with a light shielding film after the formation of a pattern of a predetermined phase shift mask including a light shielding film and a phase shifter on a mask substrate. According to this method, a planarization film is formed on the surface of a first region including the pattern defect on the mask substrate so as to cover at least the light shielding film and the pattern defect. Then, a FIB is directed on a second region on the mask substrate within the first region and including the pattern defect to etch away the planarization film and the pattern defect, followed by removing the remaining planarization film.

According to the pattern defect correction method of a photomask of the present invention, the planarization film and the pattern defect are removed simultaneously at substantially the same etching rate where the planarization film covers the pattern defect, whereby the etching process progresses maintaining a planar profile.

By setting the etching region larger than the area of the pattern defect, it is possible to monitor a change in the intensity of a secondary signal in the interface of the planarization film and the mask substrate to facilitate the detection of the end of an etching operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 1A-1J are sectional views of a photomask for showing the pattern defect correction steps according to a first embodiment of the present invention, in which FIGS. 1A-1E and FIGS. 1F-1J are taken along lines Ia—Ia and Ib—Ib, respectively, of FIG. 2.

FIG. 2 is a plan view showing the proximity of an opaque defect of a phase shift mask to which the pattern defect correction method according to the first embodiment of the present invention is applied.

FIG. 3 is a plan view showing the proximity of an opaque defect of a phase shift mask to which the pattern defect correction method of a photomask according to a second embodiment of the present invention is applied.

FIGS. 4A-4H are sectional views of a phase shift mask showing the steps of mask pattern defect correction according to the second embodiment of the present invention, in which FIGS. 4A-4D and FIGS. 4E-4H are taken along lines IVa—IVa and IVb—IVb, respectively, of FIG. 3.

FIGS. 6A-6J are sectional views of a photomask showing the steps of pattern defect correction of a photomask according to the third embodiment of the present invention, in which FIGS. 6A-6E and FIGS. 6F-6J are taken along lines VIa—VIa and VIb—VIb, respectively, of FIG. 5.

FIGS. 8A-8J are sectional views of the photomask showing the steps of pattern defect correction according to the fourth embodiment of the present invention, in which FIGS. 8A-8E and FIGS. 8F and 8J are taken along lines VIIIa—VIIIa and VIIIb—VIIIb, respectively, of FIG. 7.

FIGS. 10A-10J are sectional views of the photomask showing the steps of pattern defect correction according to the fifth embodiment of the present invention, in which FIGS. 10A-10E and FIGS. 10F-10J are taken along lines Xa—Xa and Xb—Xb, respectively, of FIG. 9.

FIGS. 12A-12L are sectional views of the photomask according to the sixth embodiment of the present invention showing the steps of pattern defect correction, in which FIGS. 12A-12F and FIGS. 12G-12L are taken along lines XIIa-XIIa and XIIb—XIIb, respectively, of FIG. 11.

FIGS. 16A-16F are sectional views of the conventional phase shift mask of FIG. 15 showing the steps of opaque defect correction, in which FIGS. 16A-16C and FIGS. 16D-16F are taken along lines XVIa—XVIa and XVIb—XVIb, respectively, of FIG. 15.

DESCRIPTION OF THE PREFERRED EMBODIMENTS

The embodiments of the photomask pattern defect correction of the present invention will be described hereinafter with reference to the figures.

Figure 1A:
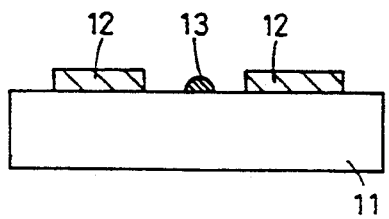
Figure 1F:
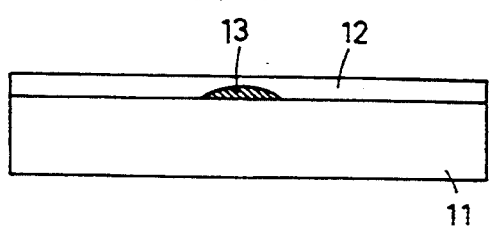

Referring to FIGS. 1A, 1F and FIG. 2, an opaque defect 13 which is a residue of the phase shift mask which should be removed is present between light shielding films 12 patterned having a gap adjacently on a mask substrate 11 formed of crystal and the like. The light shielding film 12 is formed of a metal such as Cr or an intermetallic compound such as MoSi. The opaque defect 13 which is a residue of the phase shifter is formed of a transparent material such as a SOG that is transparent with respect to exposure light of photography, similar to crystal forming the mask substrate 11. The etching rate of the light shielding film 12 and the opaque defect 13 are substantially equal with respect to the FIB.

Figure 1B:
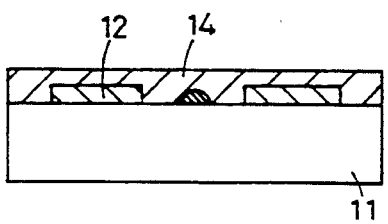
Figure 1G:
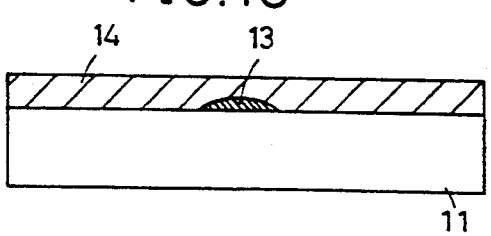
Figure 1C:
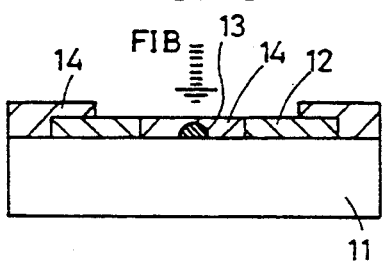
Figure 1H:
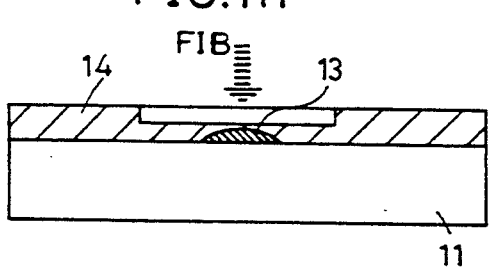

According to an opaque defect correction method of the present embodiment, a resist resin 14 serving as a planarization film is applied in a planar manner all over the surface of the mask substrate 11 of the state shown in FIGS. 1A and 1F to cover at least both the light shielding film 12 and the opaque defect 13 to result in the state shown in FIGS. 1B and 1G. The etching rates of the resist resin forming the planarization film 14 and the phase shifter material forming opaque defect 13 are substantially the same.

The FIB is directed to scan an etching region 1c indicated by a dotted line in FIG. 2 to continue the etching process until the light shielding film 12 is exposed. This etching process is a physical etching called for example Ga+ milling using Ga+ as the irradiation ion of the FIB. The irradiation energy is 30 KeV and the beam current is approximately 200-300 pA. In this etching process, the secondary signal of a secondary electron, a secondary ion, light, an X ray and the like generated from the portion where Ga+ milling progresses is monitored in real time, whereby a change in intensity of the secondary signal at the moment the surface of the light shielding film 12 is exposed is detected to set the end of the etching process.

Figure 1D:
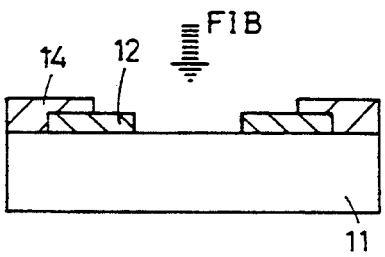
Figure 1I:
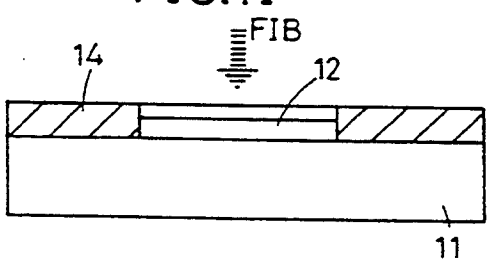

The irradiation range of scanning by the FIB is reduced to the region Id indicated by the chain dotted line in FIG. 2 and the etching process further continued. By monitoring a change in intensity of the above-mentioned secondary signal, the moment the surface of the mask substrate 11 is exposed is detected, and the etching process terminated (FIGS. 1D and 1I).

Figure 1E:
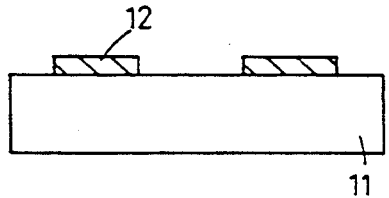
Figure 1J:
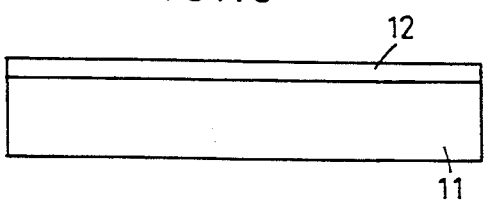

Then, the resist resin 14 is removed using a parting agent or an oxygen plasma to result in the state shown in FIGS. 1E and 1J.

Figure 17:
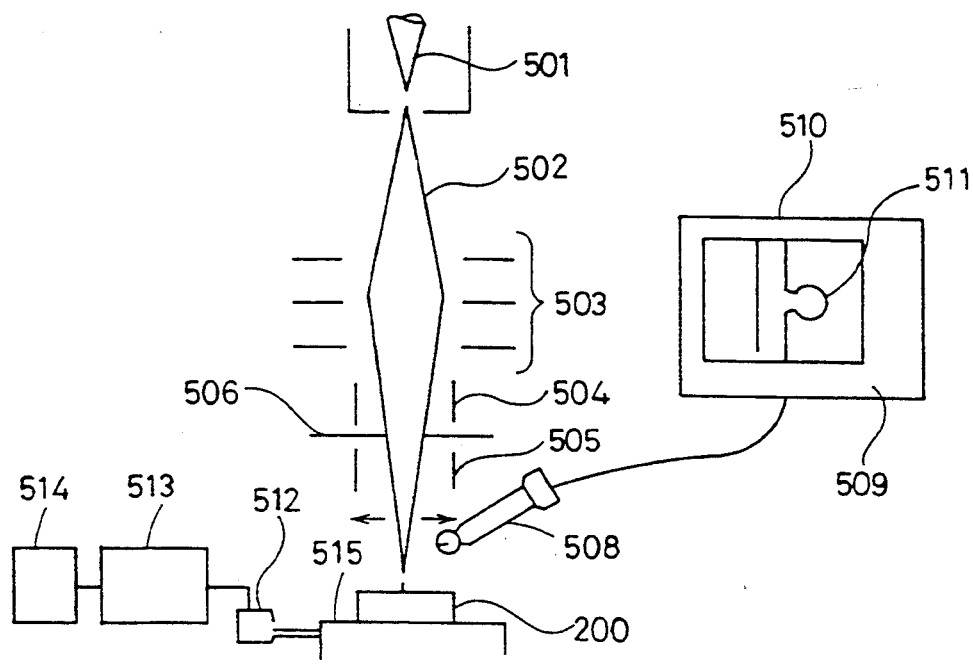
FIG. 17 is a configuration diagram of a conventional device for detecting a secondary signal used in the embodiments of the present invention.

The method of monitoring a secondary signal in the above embodiment is similar to that disclosed in, for example, Japanese Patent Laying-Open No. 64-15922. This monitoring method will be described hereinafter with reference to FIG. 17. Referring to a secondary signal monitor of FIG. 17, an ion beam 502 from a metal ion source 501 is focused by an electrostatic lens 503 and polarized by an electrode 504, an aperture 506, and a polarizing electrode 505 to be directed onto a photomask 200. The secondary charged particles (a secondary electron, a secondary ion and the like) discharged from the specimen is captured by a detector 508, whereby a scanned ion image is displayed on a display 509. By comparing this scanned ion image with a proper pattern stored in advance, the position of an opaque defect can be detected. If the region where the opaque defect exists was detected using a transmission electron microscope and the like which is another defect scanning device, the data is stored in a memory 514. A controller 513 reads out that data to control the motor 512 driving a table 515, whereby the region where the defect exists is positioned at a location which is polarization-scanned by the ion beam.

By an instruction from the controller 513, the ion beam processing device operates to direct the ion beam to scan a region slightly greater than the region including the opaque defect.

A photomask pattern defect correction method according to a second embodiment of the present invention will be described hereinafter with reference to FIGS. 3, FIGS. 4A-4D, and FIGS. 4E-4H.

Figure 4A:
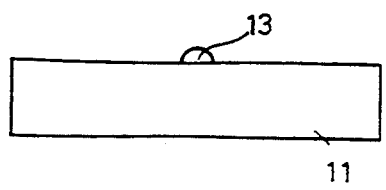
Figure 4E:
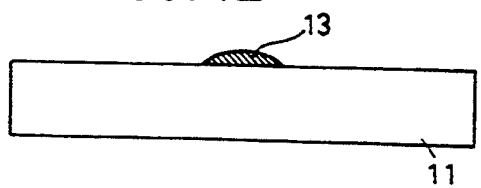
Figure 4B:
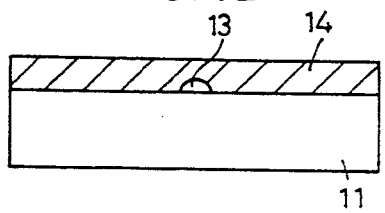
Figure 4F:
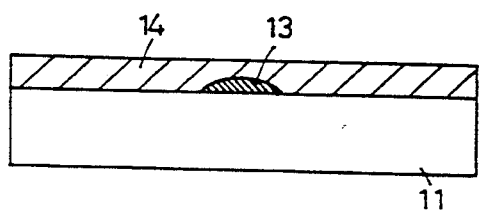
Figure 4C:
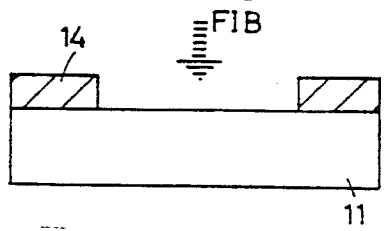
Figure 4G:
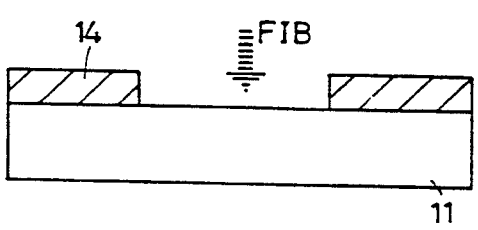
Figure 4D:
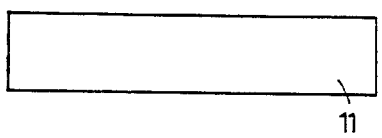
Figure 4H:
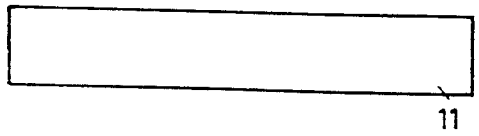

The present embodiment shows an example of a correction method where there is an opaque defect 13 in a region where a light shielding film 12 is not patterned on a mask substrate 11, as in FIG. 3. According to the present embodiment, a resist resin 14 serving as a planarization film is formed all over the mask substrate 11 of the state shown in FIGS. 4A and 4E having a thickness that covers at least the opaque defect 13 (FIGS. 4B, 4F). Then, a FIB is directed to scan the region IVc indicated by the broken line in FIG. 3. The resist resin 14 and the opaque defect 13 in the region IVc are etched. The moment the surface of the mask substrate 11 is exposed is detected by monitoring the secondary signal to stop the FIB irradiation, resulting in the state shown in FIGS. 4C and 4G. The remaining resist resin 14 is removed by a parting agent or an oxygen plasma (FIGS. 4D and 4H).

The present invention differs from the first embodiment only in that the need to specify again an etching region when the surface of the light shielding film 12 is exposed is eliminated because there is no light shielding film 12.

Figure 5:
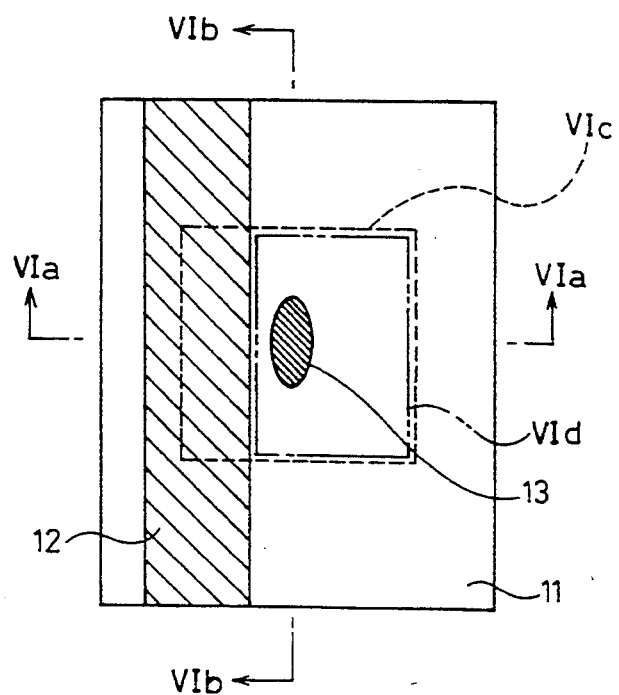
FIG. 5 is a plan view showing the proximity of an opaque defect of a phase shift mask to which the mask defect correction method of a photomask according to a third embodiment of the present invention is applied.
Figure 6A:
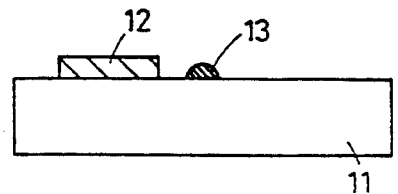
Figure 6F:
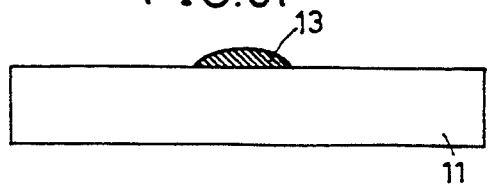
Figure 6B:
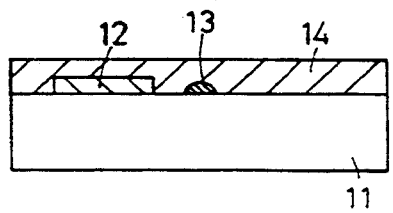
Figure 6G:
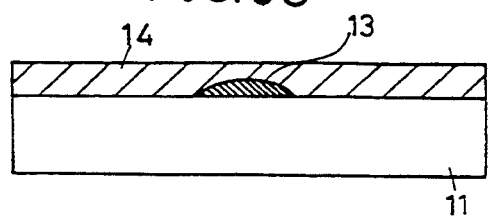
Figure 6C:
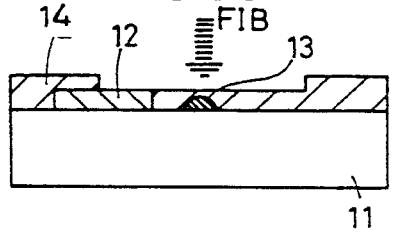
Figure 6H:
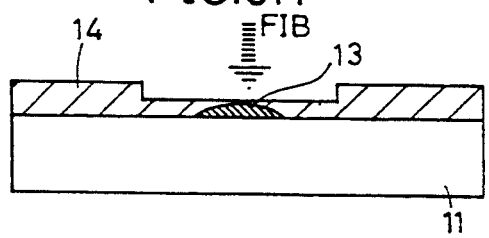
Figure 6D:
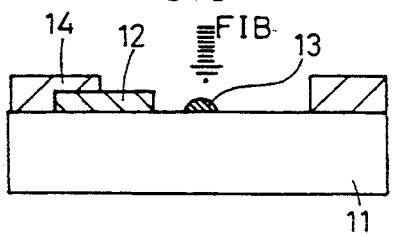
Figure 6I:
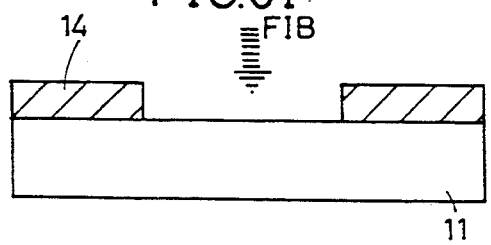
Figure 6E:
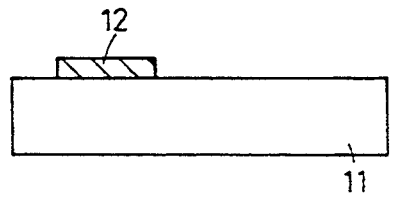
Figure 6J:
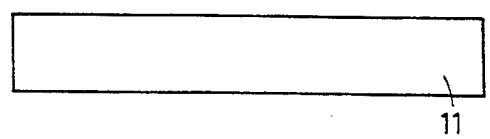

A third embodiment of the present invention will be described with reference to FIGS. 5, FIGS. 6A-6E, and FIGS. 6F-6J. The present embodiment is an opaque defect correction method where there is a pattern of a light shielding film 12 only at one side of the opaque defect 13, as shown in FIGS. 5, 6A and 6E.

The steps shown in FIGS. 6A-6E and FIGS. 6F-6J of the present embodiment are similar to the steps shown in FIGS. 1A-1E and FIGS. 1F-1J of the first embodiment, except that the cited range of the etching regions of VIc and VId differ from the etching regions of 1c and 1d of the first embodiment.

Figure 7:
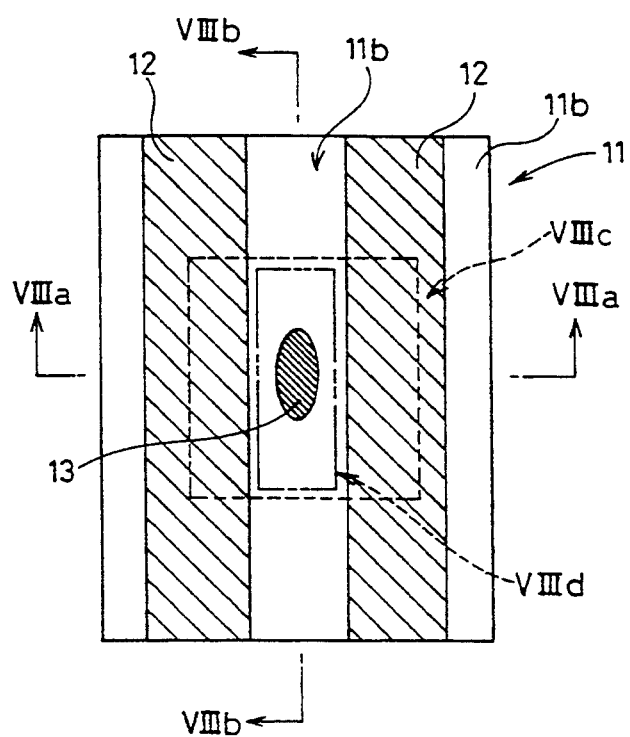
FIG. 7 is a plan view of the proximity of an opaque defect of a phase shift mask to which the pattern defect correction method of a photomask according to a fourth embodiment of the present invention is applied.
Figure 9:
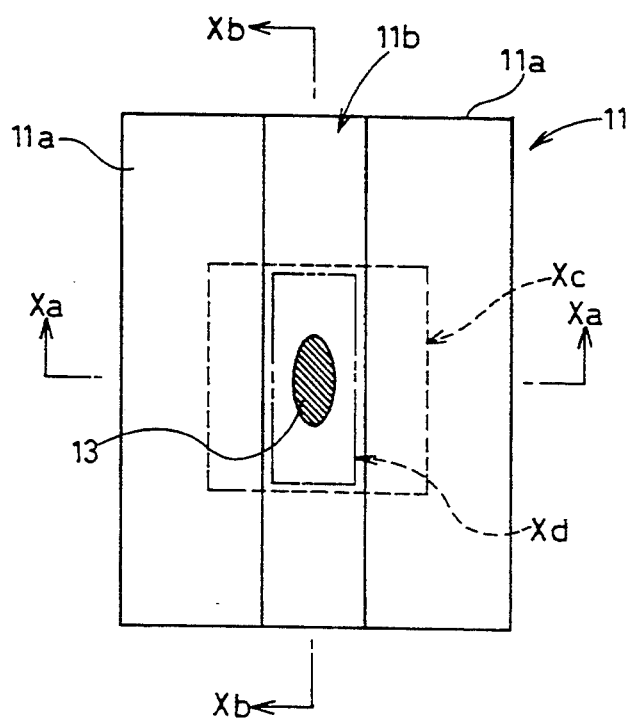
FIG. 9 is a plan view of the proximity of an opaque defect of a phase shift mask to which the pattern defect correction method of a photomask according to a fifth embodiment of the present invention is applied.
Figure 10A:
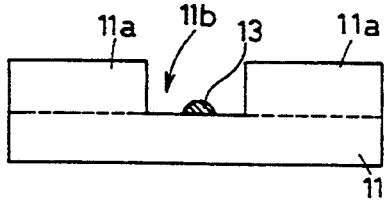
Figure 10F:
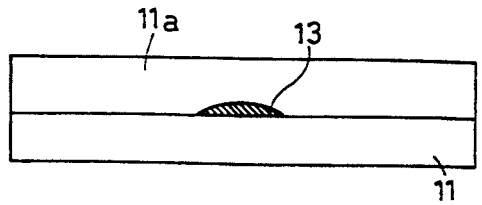
Figure 10B:
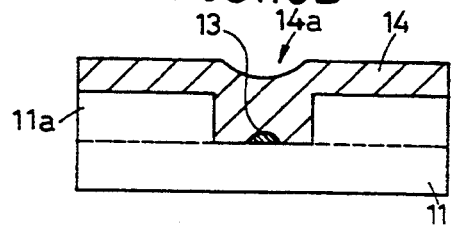
Figure 10G:
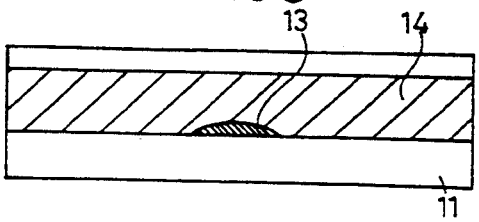
Figure 10C:
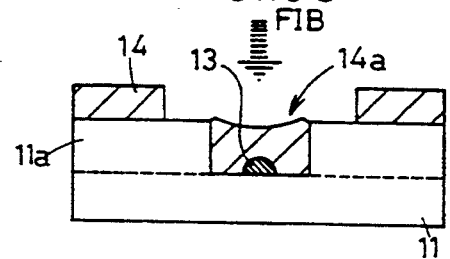
Figure 10H:
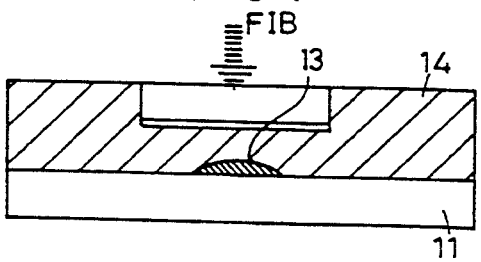
Figure 10D:
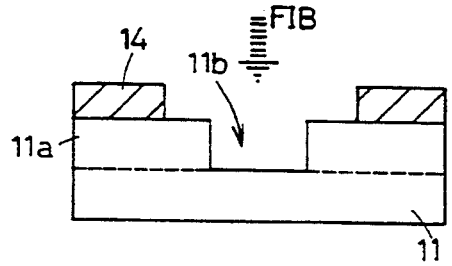
Figure 10I:
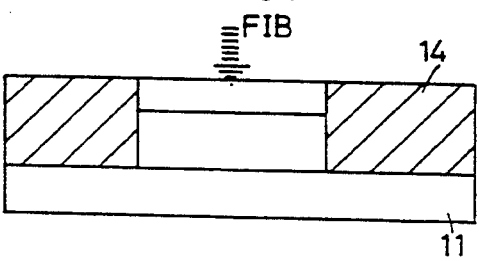
Figure 10E:
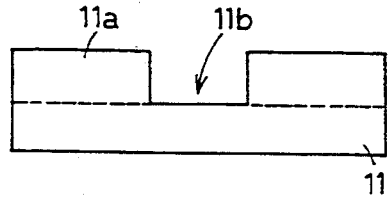
Figure 10J:
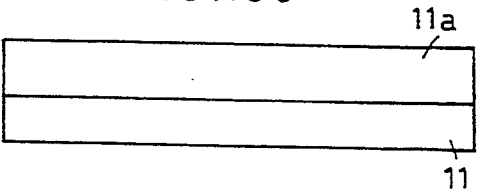
Figure 11:
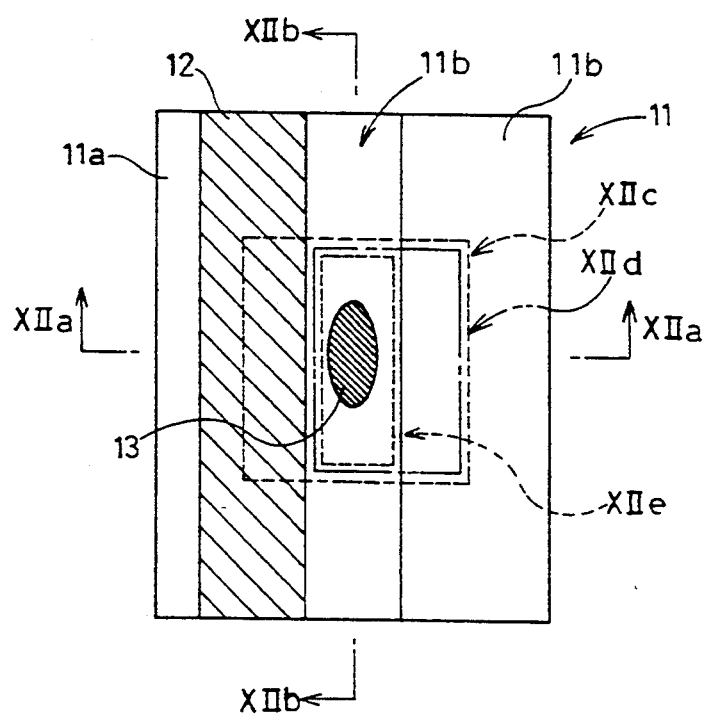
FIG. 11 is a plan view of the proximity of an opaque defect of a phase shift mask to which the pattern defect correction method of photomask according to a sixth embodiment of the present invention is applied.

A fourth embodiment of the present invention will be described with reference to FIGS. 7, FIGS. 8A-8E, and FIGS. 8F-8J. Referring to FIGS. 7, 8A, and 8F, the present embodiment is an opaque defect correction where a phase shifter layer 11a is provided at a portion of the mask substrate 11 (the portion above the broken line in FIGS. 8A-8E) beneath the region of the light shielding film 12 with an opaque defect 13 on the mask substrate 11 20 in the region 11b between adjacent phase shifter layers 11a.

In the present embodiment, a resist resin 14 serving as a planarization film is applied all over the surface of the mask substrate 11 of the state of FIGS. 8A and 8F so that at least the surface of the light shielding film 12 is covered (FIGS. 8B, 8G). At this time, a recess 14a is generated in the resist region 14 above the region 11b between the phase shift layers 11a. A FIB is directed to scan the etching region VIIIc shown in FIG. 7 to carry out an etching process until the moment the exposure of the surface of the light shielding film 12 is detected (FIGS. C, 8H). Then the etching range is reduced from region 11b to an etching region VIIId included therein, whereby etching is further carried out until the upper face of the mask substrate 11 is exposed (FIGS. 8D, 8I). The resist resin 14 is then removed by a parting agent or an oxygen plasma and the like, resulting in the state of FIGS. 8E and 8J.

The thickness of the phase shifter layer 11a of the present embodiment is determined so that the phase of the light passing through the phase shifter layer 11a is offset by a half-wavelength with the phase of the light passing through region 11b. Therefore, the etching of region 11b requires a deep and precise etching process.

Although the profile at the location of recess 14a is maintained while the etching process proceeds, the surface of the mask substrate 11 in the region 11b can be exposed in a planar manner with almost no overetching of the mask substrate 11, because the etching rate of the resist resin 14 with respect to the FIB is greater than that of the mask substrate 11.

The phase shifter layer 11a is not limited to that described in the present embodiment which is formed of a portion of the mask substrate 11, and a newly formed SOG and the like may be used by a vapor deposition method or an application method.

A fifth embodiment of the present invention will be described hereinafter with reference to FIGS. 9, FIGS. 10A-10E, and FIGS. 10F-10J. The present embodiment is equivalent to the above-described fourth embodiment except that there is no light shielding film 12. Therefore, the steps of FIGS. 10A-10E and FIGS. 10F-10J are similar to those of FIGS. 8A-8E and FIGS. 8F-8J of the above-described fourth embodiment except for the fact that the switching from the etching region of Xc to the etching region of Xd is carried out at the moment the surface of the phase shifter layer 11a is exposed.

A sixth embodiment of the present invention will be described hereinafter with reference to FIG. 11, FIGS. 12A–12F, and FIGS. 12G–12L. The present embodiment is somewhat of an intermediate of the fourth embodiment and the fifth embodiment. More specifically, the present embodiment is an opaque defect correction in the case where there is a phase shifter 11a beneath the shield film 12, with the light shielding film 12 existing on the phase shifter 11a on only one side of the opaque defect 13.

Figure 12A:
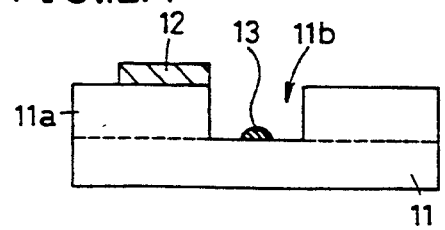
Figure 12B:
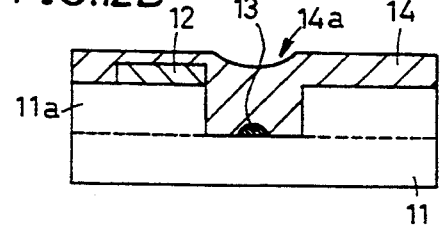
Figure 12C:
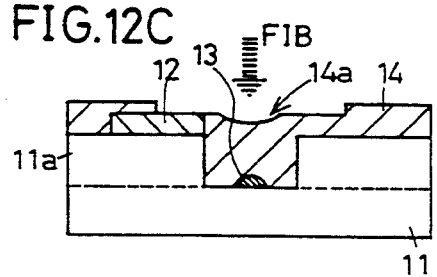
Figure 12D:
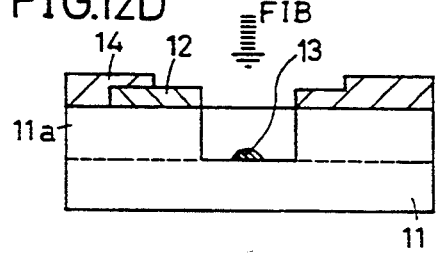
Figure 12E:
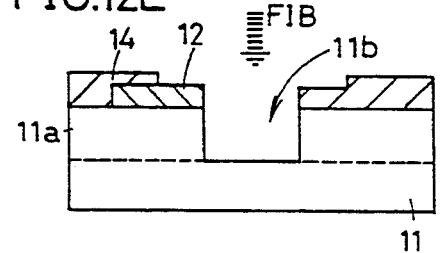
Figure 12F:
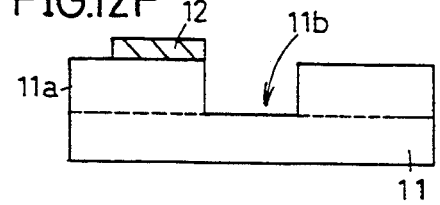
Figure 12G:
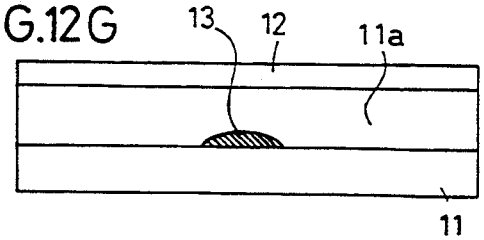
Figure 12H:
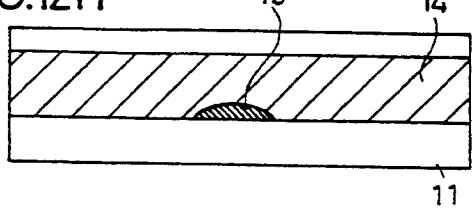
Figure 12I:
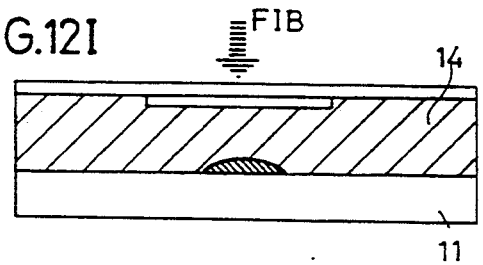
Figure 12J:
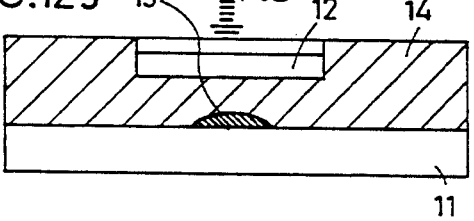
Figure 12K:
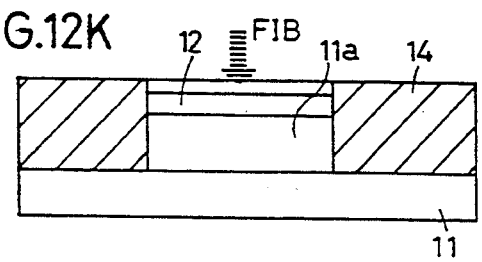
Figure 12L:
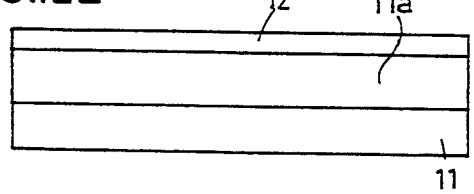
Figure 13A:
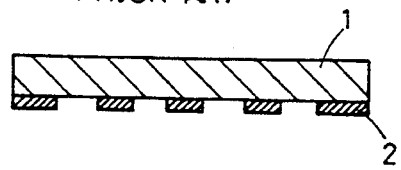
FIG. 13A is a sectional view of a conventional photomask that does not have the phase shifted.
Figure 13B:
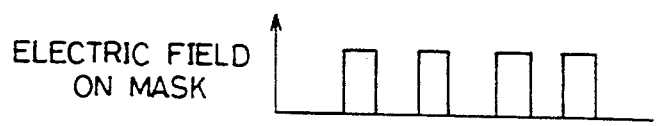
FIG. 13B shows the electric field distribution on the main surface of the photomask thereof.
Figure 13C:
FIG. 13C shows the light intensity distribution on the same main surface of the photomask.
Figure 14A:
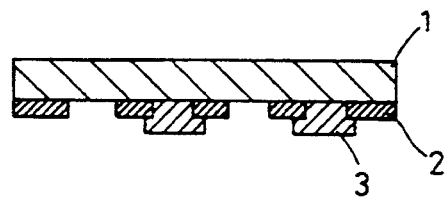
FIG. 14A is a sectional view of a conventional phase shift mask.
Figure 14B:
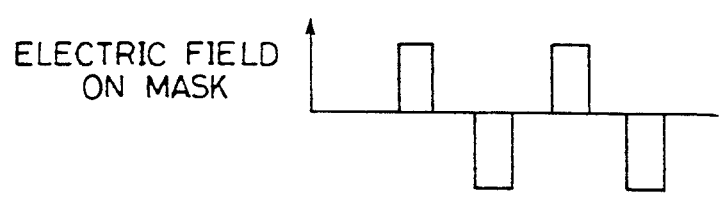
FIG. 14B shows the electric field distribution on the main surface where a mask pattern 2 is formed on the phase shift mask thereof.
Figure 14C:
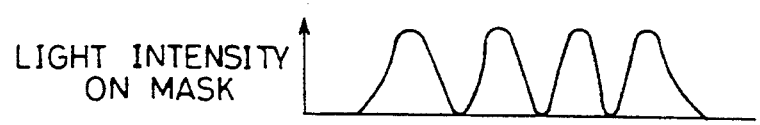
FIG. 14C shows the light intensity distribution on the same main surface.
Figure 15:
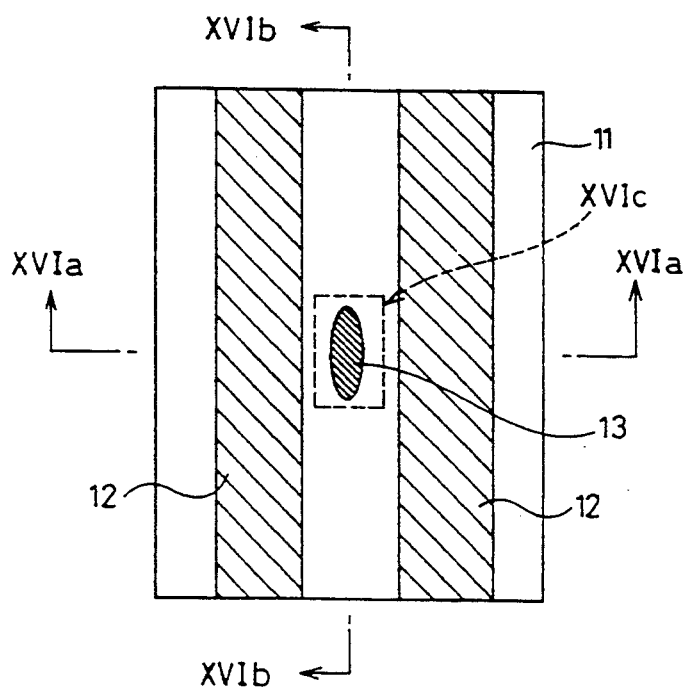
FIG. 15 is a plan view showing the proximity of an opaque defect of a conventional phase shift mask.
Figure 16A:
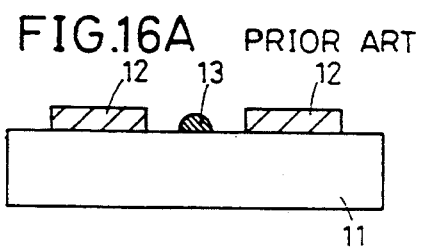
Figure 16D:
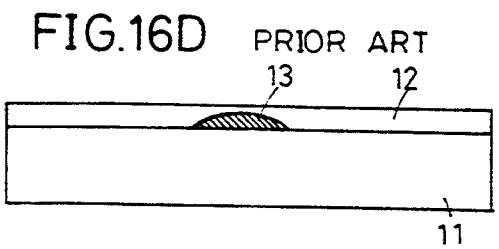
Figure 16B:
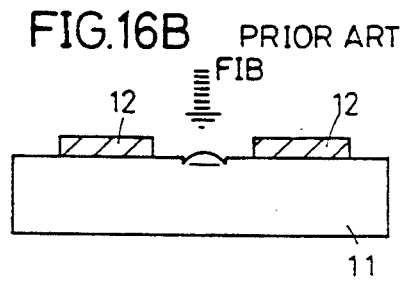
Figure 16E:
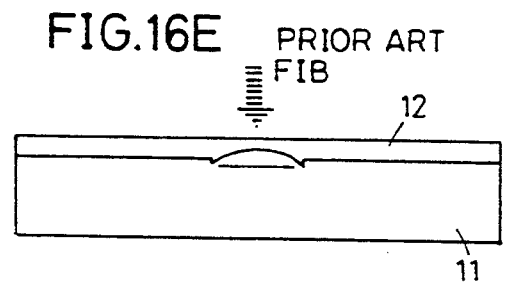
Figure 16C:
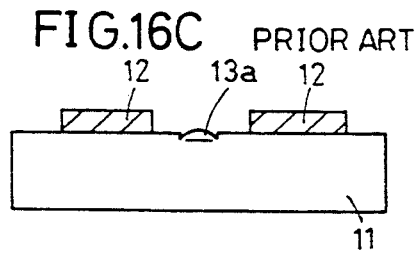
Figure 16F:
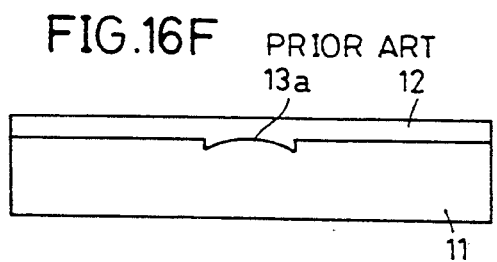

According to the present embodiment, a resist resin 12 serving as a planarization film is applied all over the surface of the mask substrate 11 of the state of FIGS. 12A and 12G so as to cover at least the surface of the light shielding film 12 (FIGS. 12B, 12H) There is a recess 14a on the resist resin 12 on the region 11b. A FIB is directed to scan an etching region XIIc shown in FIG. 11 to carry out etching until the surface of the light shielding film 12 is exposed (FIGS. 12C, 12I). Next, the etching range is reduced to the region of XIId to carry out etching until the surface of the phase shifter 11a is exposed (FIGS. 12D, 12J). Then, the etching range is further reduced to a region of XIIe to carry out etching until the surface of the mask substrate in region 11b is etched (FIGS. 12E, 12K). Then the resist resin 14 is removed, resulting in the state shown in FIGS. 12F and 12L.

The steps of the present embodiment are similar to those of the fourth and fifth embodiment with the same effects, except that the reduction of the etching region is carried out in two stages.

Figure 18:
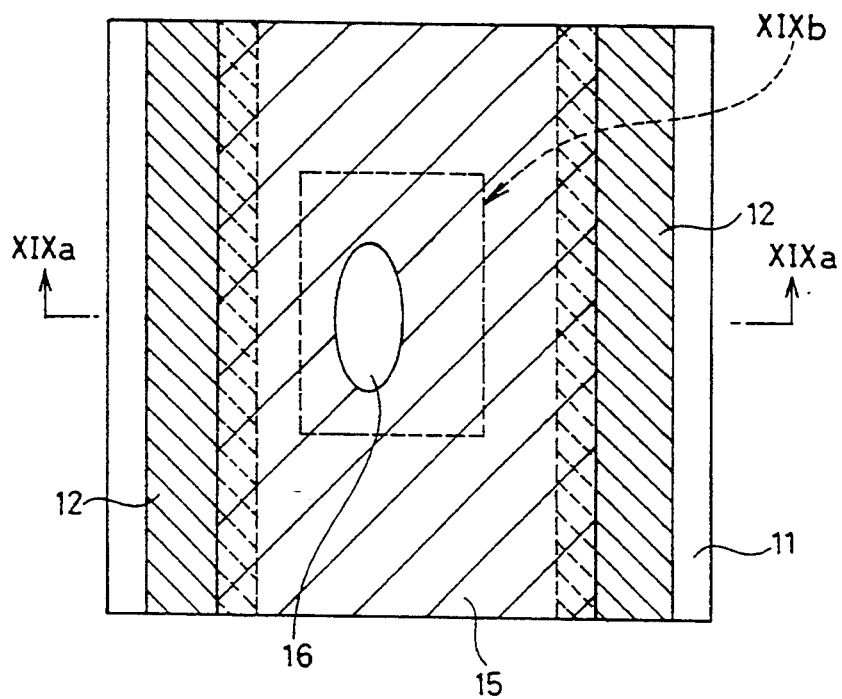
FIG. 18 is a plan view of the proximity of a clear defect of a phase shift mask to which the pattern defect correction method of the photomask according to a seventh embodiment of the present invention is applied.

A seventh embodiment of the present invention will be described with reference to FIGS. 18 and FIGS. 19A–19E. The present embodiment relates to a method of correcting a clear defect in comparison with the above-described first–sixth embodiments which are related to correcting an opaque defect. More specifically, the present embodiment is an example of a clear defect correction method where a phase shifter 15 is provided in a region between light shielding films 12 formed adjacently on a mask substrate 11 with a clear defect 16 which is a defect of the phase shifter material in the phase shifter 15, as shown in FIGS. 18 and 19A.

Figure 19A:
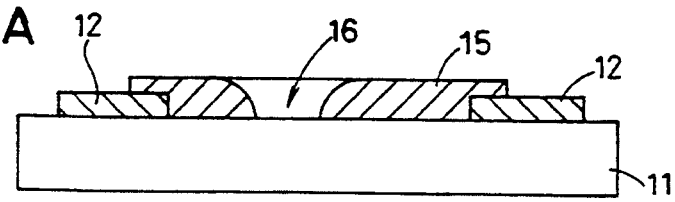
FIGS. 19A-19E are sectional views of the photomask according to the seventh embodiment of the present invention showing the steps of pattern defect correction, respectively taken along lines XIXa—XIXa of FIG. 18.
Figure 19B:
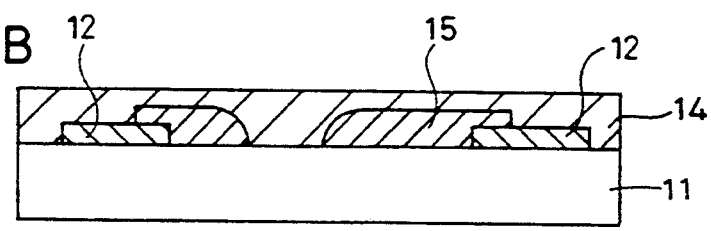
Figure 19C:
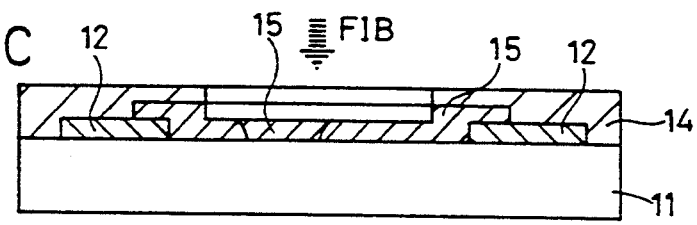
Figure 19D:
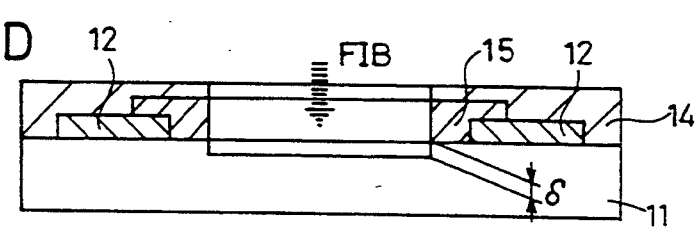
Figure 19E:
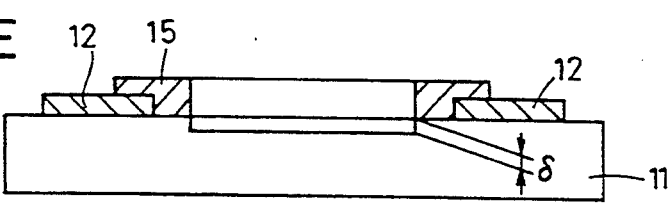

In the present embodiment, a resist resin 14 serving as a planarization film is applied all over the surface of the mask substrate 11 shown in FIG. 19A so as to cover at least the surface of the light shielding film 12 and the phase shifter 15 (FIG. 19B). Then, a FIB is directed to scan the region XIXb shown in the broken line in FIG. 18 to carry out etching (FIG. 19C). The etching process is continued in the same region even after the surface of the mask substrate 11 is exposed until a depth of $\delta$ from surface of the mask substrate 11 is reached (FIG. 19D). Then, the resist resin 14 is removed, resulting in the state shown in FIG. 19E.

According to the present embodiment where the thickness of the mask substrate 11 is made thinner by $\delta$ in the region XIXb, the phase of the light transmitting the mask substrate 11 in this region is made to be offset by a half-wavelength with respect to the phase of the light transmitting other regions. The performance as a phase shift mask can be obtained in regions where a clear defect occurs equivalent to a phase shifter 15.

According to the photomask pattern defect correction method of the above-described embodiments, planarization of a defected region with a planarization film allows etching to be carried out in uniform without being affected by the profile of the defect to easily correct the defect. Because it is easy to detect the moment the etching has reached the interface between the planarization film and the mask substrate, the termination of the etching process can be detected precisely. Therefore, correction of a defect can be carried out with high precision in the depth direction without the mask substrate being overetched.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of correcting a pattern defect of a photomask by removing a pattern defect of a phase shifter generated in a region where a light shielding film does not exist on the surface of a mask substrate, after the formation of a pattern of a predetermined phase shift mask including the light shielding film and the phase shifter on the mask substrate, comprising the steps of:

providing a planarization film to cover a surface of a first region, including said pattern defect on said mask substrate such that the pattern defect is encircled by the planarization film;

directing a focused ion beam on a second region on said mask substrate within said first region and including said pattern defect encircled by the planarization film for etching said planarization film in said second region and said pattern defect simultaneously; and removing said planarization film outside said second region.

2. The pattern defect correction method according to claim 1, wherein:

said step of simultaneously etching said planarization film and said pattern defect comprises the step of stopping the etching operation at the moment the etching reaches the interface of said planarization film and said mask substrate.

3. The pattern defect correction method according to claim 1, wherein:

said step of simultaneously etching said planarization film and said pattern defect comprises the step of identifying the progress of said etching by detecting a secondary signal obtained from said planarization film and a secondary signal obtained from said mask substrate when said focused ion beam is directed.

4. The pattern defect correction method according to claim 1, wherein:

the etching rate of said planarization film with respect to the focused ion beam is substantially equal to that of the material of said phase shifter with respect to the focused ion beam.

5. The pattern defect correction method according to claim 1, wherein:

said pattern defect comprises an opaque defect which is a residue of a phase shifter to be removed on the surface of the mask substrate where said light shielding film is not formed.

6. The pattern defect correction method according to claim 1, wherein:

said pattern defect comprises a clear defect generated by a damage in a portion of a phase shifter provided in a region between adjacent formed light shielding films on the surface of the mask substrate.

7. The pattern defect correction method according to claim 6, wherein:

said step of covering the surface of said first region with said planarization film comprises the step of covering said phase shifter including a clear defect with a planarization film, and wherein said step of directing a focused ion beam for etching said planarization film and said pattern defect comprises the step of removing all of said planarization film and said phase shifter in a region including at least said clear defect of the region where said phase shifter is formed, and removing the surface of said mask substrate to a selected depth, by directing the focused ion beam to said region.

8. The pattern defect correction method according to claim 1, wherein:

said step of covering said first region with said planarization film comprises the step of applying a resist resin in planarization on said mask substrate in said first region.

9. The pattern defect correction method of a photomask according to claim 1, wherein:

said step of etching said planarization film and said pattern defect is carried out by a focused ion beam etching using gallium ions as the irradiation ions.

10. The pattern defect correction method according to claim 2, wherein:

said step of stopping the etching operation at the moment the etching reaches the interface of said planarization film and said mask substrate comprises the further step of monitoring in real time a secondary signal selected from a secondary electron, a secondary ion, light and an X ray generated, from the portion where etching by the focused ion beam is carried out, to detect a change in the intensity of the secondary signal at the moment the surface of said mask substrate is exposed and to simultaneously cease the etching process.

11. The pattern defect correction method according to claim 1, wherein:

said second region on said mask substrate comprises a region where said planarization film covers the light shielding film formed on the surface of said mask substrate, and wherein said step of etching said planarization film and said pattern defect comprises a first etching step of directing a focused ion beam to said second region to etch said planarization film, and ceasing the etching at the moment said light shielding film is exposed, and a second etching step of directing a focused ion beam only to a third region in said second region including said pattern defect and where said light shielding film is not formed to etch said planarization film and said pattern defect, and ceasing the etching at the moment the surface of said mask substrate is exposed.

12. The pattern defect correction method according to claim 11, wherein:

said first etching step comprises the further step of monitoring in real time a secondary signal selected from a secondary electron, a secondary ion, light and an X ray generated, from the portion where etching by the focused ion beam is carried out, to cease the etching just when a change in the intensity of a secondary signal is detected at the moment said light shielding film is exposed.

13. The pattern defect correction method according to claim 1, wherein:

said first region includes a portion of said phase shifter, and the method further comprises a step of directing a focused ion beam on a third region on said mask substrate, before said step of directing a focused ion beam on said second region, until a surface of said phase shifter is exposed, wherein said third region is defined within said first region so as to enclose said second region and to exclude all of said phase shifter.

14. A method of correcting a pattern defect of a photomask by removing a pattern defect of a phase shifter generated in a region where a light shielding film does not exist on the surface of a mask substrate, after the formation of a pattern of a selected phase shift mask including the light shielding film and the phase shifter on the mask substrate, comprising the steps of:

providing a planarization film to cover a surface of a first region including said pattern defect on said mask substrate such that the pattern defect is encircled by the planarization film;

directing a focused ion beam on a second region on said mask substrate within said first region and including said pattern defect encircled by the planarization film for etching said planarization film in said second region and said pattern defect simultaneously; and removing said planarization film outside said second region, wherein said step of simultaneously etching said planarization film and said pattern defect comprises a step of stopping the etching operation at the moment the etching reaches the interface of said planarization film and said mask substrate, and wherein the etching rate of said planarization film with respect to the focused ion beam is substantially equal to that of the material of said phase shifter with respect to the focused ion beam.

15. The pattern defect correction method according to claim 14, wherein:

said first region includes a portion of said phase shifter, and the method further comprises a step of directing a focused ion beam on a third region on said mask substrate, before said step of directing a focused ion beam on said second region, until a surface of said phase shifter is exposed, wherein said third region is defined within said first region so as to enclose said second region and to exclude all of said phase shifter.

* * * * *